(12) United States Patent
Kiyohara et al.

(10) Patent No.: US 9,621,107 B2
(45) Date of Patent: Apr. 11, 2017

(54) OSCILLATION CIRCUIT, OSCILLATOR, ELECTRONIC APPARATUS, AND MOVING OBJECT

(71) Applicant: Seiko Epson Corporation, Tokyo (JP)

(72) Inventors: Atsushi Kiyohara, Chino (JP); Masayuki Ishikawa, Ebina (JP); Yosuke Itasaka, Tatsuno (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/740,444

(22) Filed: Jun. 16, 2015

(65) Prior Publication Data
US 2015/0365050 A1    Dec. 17, 2015

(30) Foreign Application Priority Data

Jun. 17, 2014    (JP) ................. 2014-124061

(51) Int. Cl.
*H03B 5/04*    (2006.01)
*H03B 5/36*    (2006.01)
*H03L 1/00*    (2006.01)

(52) U.S. Cl.
CPC ............... *H03B 5/368* (2013.01); *H03B 5/04* (2013.01); *H03B 5/362* (2013.01); *H03L 1/00* (2013.01); *H03B 2201/031* (2013.01)

(58) Field of Classification Search
CPC ... H03B 5/04; H03B 5/30; H03B 5/32; H03B 5/36; H03B 5/362; H03B 5/364; H03B 5/366; H03B 5/368; H03B 2201/038; H03L 1/00

USPC .... 331/68, 116 FE, 116 M, 116 R, 154, 158, 331/185, 186
See application file for complete search history.

(56) References Cited

U.S. PATENT DOCUMENTS

| | | | | |
|---|---|---|---|---|
| 4,442,415 A | * | 4/1984 | Ashida | H03J 5/24 331/116 R |
| 5,004,988 A | * | 4/1991 | Ueno | H03L 1/023 331/116 R |
| 5,760,656 A | * | 6/1998 | Sutliff | H03B 5/368 331/116 R |
| 5,801,594 A | * | 9/1998 | Muto | H03L 1/025 331/158 |
| 5,883,550 A | * | 3/1999 | Watanabe | H03L 1/023 331/116 R |
| 5,929,715 A | * | 7/1999 | Nakamiya | G04F 5/06 331/158 |

(Continued)

FOREIGN PATENT DOCUMENTS

| | | | |
|---|---|---|---|
| JP | 11-136032 A | 5/1999 | |
| JP | 03-171907 B2 | 6/2001 | |

(Continued)

*Primary Examiner* — Levi Gannon
(74) *Attorney, Agent, or Firm* — Harness, Dickey & Pierce, P.L.C.

(57) ABSTRACT

An oscillation circuit includes a circuit for oscillation and a signal adjustment circuit connected to the circuit for oscillation. An input voltage based on a direct-current voltage, a voltage value of which can be changed, is input to the circuit for oscillation and the signal adjustment circuit. The circuit for oscillation causes a vibration piece to oscillate and outputs a first oscillation signal. A frequency of the first oscillation signal is adjusted according to the voltage value output from the signal adjustment circuit.

13 Claims, 10 Drawing Sheets

(56) References Cited

U.S. PATENT DOCUMENTS

| | | | | |
|---|---|---|---|---|
| 7,276,984 B2* | 10/2007 | Hagino | ................ | H03K 3/0307 |
| | | | | 327/535 |
| 7,471,164 B2* | 12/2008 | Reimann | ................ | H03L 1/023 |
| | | | | 331/117 R |
| 7,602,107 B2* | 10/2009 | Moriya | ................ | H03H 9/0547 |
| | | | | 29/594 |
| 7,808,333 B2 | 10/2010 | Takeuchi et al. | | |
| 8,143,963 B2* | 3/2012 | Lin | ................ | H03L 1/022 |
| | | | | 331/116 FE |
| 9,041,476 B2* | 5/2015 | Asamura | ................ | H03H 9/0538 |
| | | | | 331/154 |
| 2001/0002804 A1* | 6/2001 | Koszarsky | ................ | H03B 5/1203 |
| | | | | 331/36 C |
| 2002/0050867 A1* | 5/2002 | Kato | ................ | H03B 5/04 |
| | | | | 331/116 R |
| 2004/0155715 A1* | 8/2004 | Nakamura | ................ | H03B 5/36 |
| | | | | 331/158 |
| 2010/0060367 A1* | 3/2010 | Harima | ................ | H03H 9/1014 |
| | | | | 331/68 |
| 2014/0361842 A1* | 12/2014 | Chen | ................ | H03B 5/36 |
| | | | | 331/44 |
| 2015/0042410 A1* | 2/2015 | Yoneyama | ................ | H03B 5/04 |
| | | | | 331/158 |

FOREIGN PATENT DOCUMENTS

| | | |
|---|---|---|
| JP | 2003-188646 A | 7/2003 |
| JP | 2004-146882 A | 5/2004 |
| JP | 2004-193965 A | 7/2004 |
| JP | 2008-289139 A | 11/2008 |
| JP | 2011-135536 A | 7/2011 |
| JP | 2012-142685 A | 7/2012 |

* cited by examiner

OSCILLATION CIRCUIT, OSCILLATOR, ELECTRONIC APPARATUS, AND MOVING OBJECT

BACKGROUND

1. Technical Field

The present invention relates to an oscillation circuit, an oscillator, an electronic apparatus, and a moving object.

2. Related Art

As a stable frequency-control electronic component in the communication apparatus field, an oscillator has been used that includes, in a package, a vibration piece formed of a piezoelectric body such as quartz and an oscillation circuit that outputs a signal having a predetermined frequency and changes or adjusts an output frequency according to a control voltage input from the outside. In the package of the oscillator, a large number of external connection terminals including a power supply terminal (VCC) that drives the oscillation circuit, a ground terminal (GND), a signal output terminal (RFOUT), and a frequency-control-voltage input terminal (VCONT) are provided. However, when the large number of external connection terminals are provided in the package, it is difficult to reduce the size of the oscillator. Therefore, there has been proposed an oscillator in which a plurality of functions are imparted to one external connection terminal. For example, JP-A-2004-146882 (Patent Literature 1) discloses a digital-control-temperature-compensation reference oscillator including an internal storage device that stores digital temperature compensation data. In the digital-control-temperature-compensation reference oscillator, a power supply terminal also functions as a clock signal input terminal used for writing in the internal storage device. Consequently, the number of external connection terminals provided in a package is reduced to attain a reduction in the size of the oscillator.

With the oscillator disclosed in Patent Literature 1, since the number of external connection terminals can be reduced, it is possible to attain a reduction in the size of the oscillator. However, a clock signal, which is a frequency signal, needs to be superimposed on a direct-current voltage for driving a circuit for oscillation and supplied to the power supply terminal. However, when the clock signal is supplied to the power supply terminal of the circuit for oscillation, since the clock signal is input to the circuit for oscillation as noise, it is likely that frequency accuracy of an oscillation signal output from the oscillator is deteriorated. Therefore, it is difficult to realize an oscillation circuit (an oscillator) that can suppress deterioration in frequency accuracy caused by a reduction in the number of external connection terminals and can be reduced in size.

SUMMARY

An advantage of some aspects of the invention is to solve at least a part of the problems described above, and the invention can be implemented as the following forms or application examples.

Application Example 1

This application example is directed to an oscillation circuit including a circuit for oscillation and a signal adjustment circuit connected to the circuit for oscillation. An input voltage based on a direct-current voltage is input to the circuit for oscillation and the signal adjustment circuit. The circuit for oscillation causes a vibration piece to oscillate and outputs a first oscillation signal. The signal adjustment circuit outputs a voltage controlled by changing the direct-current voltage. A frequency of the first oscillation signal is adjusted according to the voltage output from the signal adjustment circuit.

According to this application example, the oscillation circuit includes the circuit for oscillation and the signal adjustment circuit. The oscillation circuit has hitherto needed power supplies of two systems, i.e., a direct-current voltage applied as a power supply for driving of the circuit for oscillation and a direct-current voltage, a voltage value of which can be changed, applied to the signal adjustment circuit in order to adjust the frequency of the first oscillation signal. However, in the oscillation circuit in this application example, an input voltage based on the direct-current voltage, the voltage value of which can be change, of one system obtained by superimposing a direct-current voltage, which has variable width of a voltage value necessary for the signal adjustment circuit, on a direct-current voltage for the circuit for oscillation is input to the circuit for oscillation and the signal adjustment circuit. In other words, direct-current voltages other than a ground voltage supplied to the circuit for oscillation and the signal adjustment circuit from the outside can be reduced to one system. Therefore, it is possible to reduce the number of external connection terminals of a container that houses the oscillation circuit. Since the superimposed input voltage does not include a frequency signal, the input voltage is less likely to be noise for the first oscillation signal. It is possible to suppress deterioration in frequency accuracy of the first oscillation signal caused by the reduction in the number of external connection terminals. Therefore, it is possible to provide the oscillation circuit that can suppress the deterioration in the frequency accuracy of the first oscillation signal output from the circuit for oscillation and can reduce the size of an oscillator.

Application Example 2

It is preferable that the oscillation circuit according to the application example described above further includes a voltage adjustment circuit connected to the circuit for oscillation, and the voltage adjustment circuit receives an input of the input voltage, converts the direct-current voltage into a predetermined voltage value, and outputs the predetermined voltage value to the circuit for oscillation.

According to this application example, the oscillation circuit includes the voltage adjustment circuit that, even if a voltage value of the input voltage fluctuates, converts the voltage value into the predetermined voltage value and outputs the predetermined voltage value. The direct-current voltage output from the voltage adjustment circuit is supplied as the power supply for driving of the circuit for oscillation. Even if the voltage value of the input voltage supplied from the outside is changed in order to adjust the frequency of the first oscillation signal, the voltage value of the direct-current voltage output from the voltage adjustment circuit and input as the power supply for driving of the circuit for oscillation is fixed. Therefore, the direct-current voltage is less likely to be noise for the first oscillation signal. It is possible to suppress deterioration in frequency accuracy of the first oscillation signal. Therefore, it is possible to provide the oscillation circuit that can suppress the deterioration in the frequency accuracy of the first oscillation signal output from the circuit for oscillation and can reduce the size of an oscillator.

Application Example 3

In the oscillation circuit according to the application example described above, it is preferable that the circuit for oscillation includes a variable capacitance element, and a capacitance value of the variable capacitance element is set according to a voltage value output from the signal adjustment circuit.

According to this application example, the circuit for oscillation includes the variable capacitance element, the capacitance value of which is set according to the voltage value output from the signal adjustment circuit. A direct-current voltage output from the signal adjustment circuit according to a voltage value of the input voltage input to the signal adjustment circuit is applied to the variable capacitance element. Consequently, it is possible to adjust the frequency of the first oscillation signal output from the circuit for oscillation.

Application Example 4

In the oscillation circuit according to the application example described above, it is preferable that the signal adjustment circuit includes an automatic frequency control circuit.

According to this application example, the signal adjustment circuit includes the automatic frequency control circuit. Therefore, it is possible to easily generate a direct-current voltage applied to the variable capacitance element in order to adjust the frequency of the first oscillation signal.

Application Example 5

This application example is directed to an oscillator including: the oscillation circuit according to any of the application examples described above; a vibration piece; and a container including the oscillation circuit and the vibration piece. The container includes: a first side and a second side opposed to each other in plan view; a third side and a fourth side crossing the first side and the second side and opposed to each other in plan view; a first terminal in contact with at least one side among the first side, the second side, and the third side and disposed in a direction along the third side; a second terminal in contact with at least one side among the first side, the second side, and the fourth side and disposed in a direction along the fourth side; and a third terminal provided between the first terminal and the second terminal. The first terminal is a terminal to which an input voltage based on a direct-current voltage, a voltage value of which can be changed, is applied. The second terminal is a terminal to which a ground voltage is applied. The third terminal is a terminal from which a first oscillation signal output from the oscillation circuit is output.

According to this application example, the oscillator includes the oscillation circuit, the vibration piece, and the container. The oscillation circuit includes the circuit for oscillation and the signal adjustment circuit. The oscillation circuit has hitherto needed power supplies of two systems, i.e., a direct-current voltage applied as a power supply for driving of the circuit for oscillation and a direct-current voltage, a voltage value of which can be changed, applied to the signal adjustment circuit in order to adjust the frequency of the first oscillation signal. However, in the oscillation circuit in this application example, a direct-current voltage of one system obtained by superimposing a direct-current voltage, which has variable width of a voltage value necessary for the signal adjustment circuit, on a direct-current voltage of the circuit for oscillation is input to the circuit for oscillation and the signal adjustment circuit. In other words, direct-current voltages other than a ground voltage supplied to the circuit for oscillation and the signal adjustment circuit from the outside can be reduced to an input voltage based on the direct-current voltage, the voltage value of which can be changed, of one system. Consequently, the oscillator capable of adjusting the frequency of the first oscillation signal can be configured by the small container including the three external connection terminal, i.e., the first terminal to which the input voltage is applied, the second terminal to which the ground voltage is applied, and the third terminal from which the first oscillation signal is output. Since the superimposed input voltage does not include a frequency signal, the input voltage is less likely to be noise for the first oscillation signal. It is possible to suppress deterioration in frequency accuracy of the first oscillation signal. Therefore, it is possible to provide the oscillator that suppresses the deterioration in the frequency accuracy of the first oscillation signal output from the circuit for oscillation and is deduced in size.

Application Example 6

In the oscillator according to the application example described above, it is preferable that the container includes a fourth terminal provided between any one of the first terminal and the second terminal and the third terminal, and a second oscillation signal output from the oscillation circuit is output from the fourth terminal.

According to this application example, the fourth terminal that outputs the second oscillation signal is provided in the container of the oscillator. Therefore, it is possible to configure a differential output oscillator that outputs frequency signals having polarities opposite to each other and a two-frequency output oscillator that outputs two kinds of different frequency signals.

Application Example 7

This application example is directed to an electronic apparatus including the oscillation circuit according to any of Application Examples 1 to 4.

According to this application example, the electronic apparatus includes the oscillation circuit that can reduce the size of the oscillator. Therefore, it is possible to provide a small electronic apparatus.

Application Example 8

This application example is directed to a moving object including the oscillation circuit according to any of Application Examples 1 to 4.

According to this application example, the moving object includes the oscillation circuit that can reduce the size of the oscillator. Therefore, it is possible to provide a small moving object.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferred embodiments of the invention are explained below with reference to the drawings. Note that, in the figures referred to below, in order to show layers and members in recognizable sizes, scales of the layers and the members are set different from actual scales.

In FIGS. 1 to 3, FIG. 5, and FIG. 6, for convenience of explanation, as three axes orthogonal to one another, an X axis, a Y axis, and a Z axis are shown. A distal end side of an arrow indicating an axial direction is represented as "+ side" and a proximal end side of the arrow is represented as "− side". In the following explanation, a direction parallel to the X axis is referred to as "X-axis direction", a direction parallel to the Y axis is referred to as "Y-axis direction", and a direction parallel to the Z axis is referred to as "Z-axis direction".

First Embodiment

Figure 1:
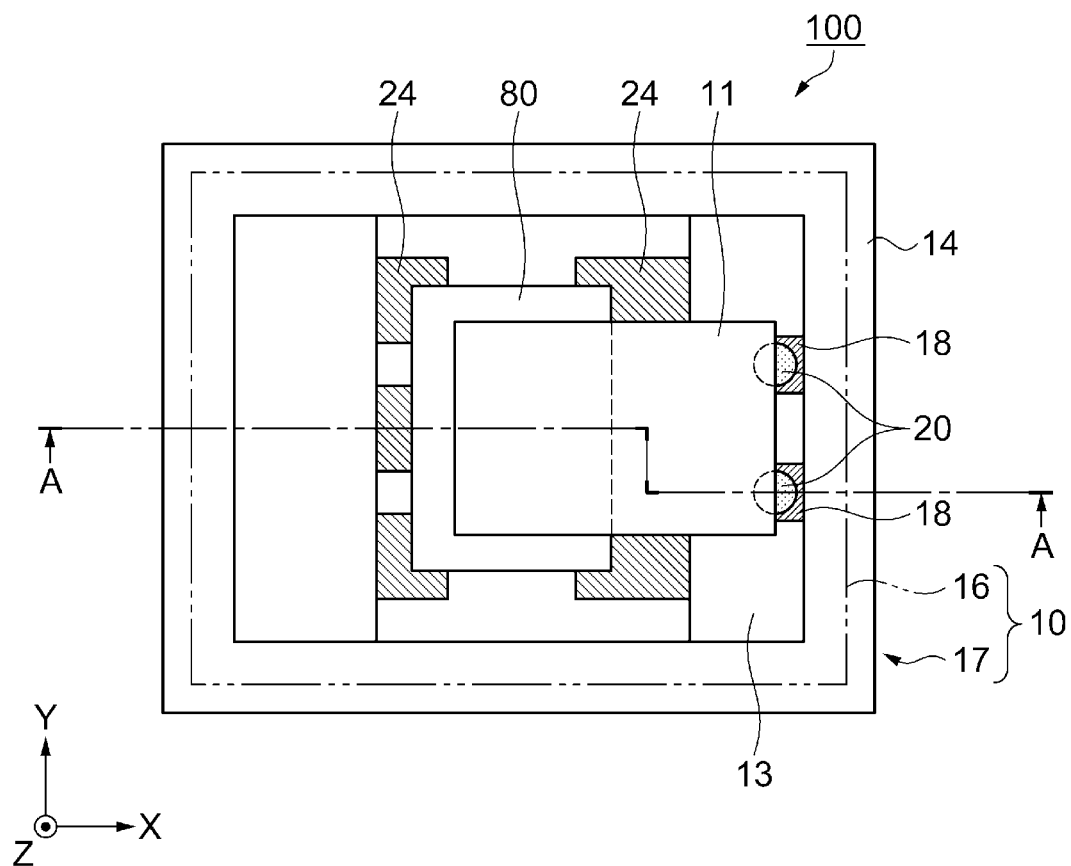
FIG. 1 is a schematic plan view showing the schematic configuration of an oscillator according to a first embodiment.
Figure 2:
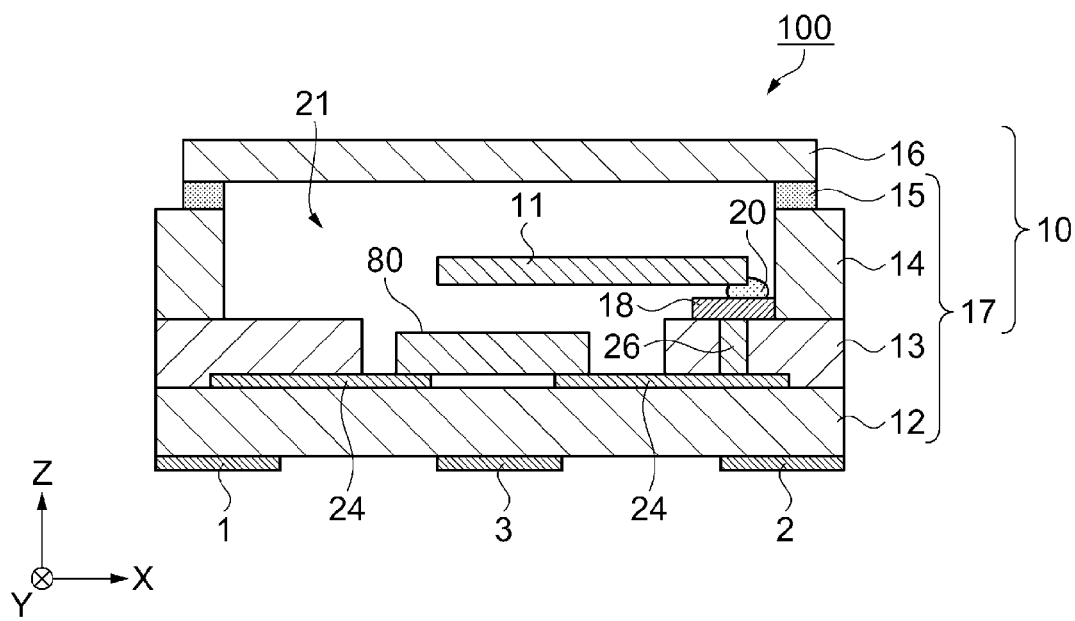
FIG. 2 is a sectional view of the oscillator taken along line A-A in FIG. 1.
Figure 3:
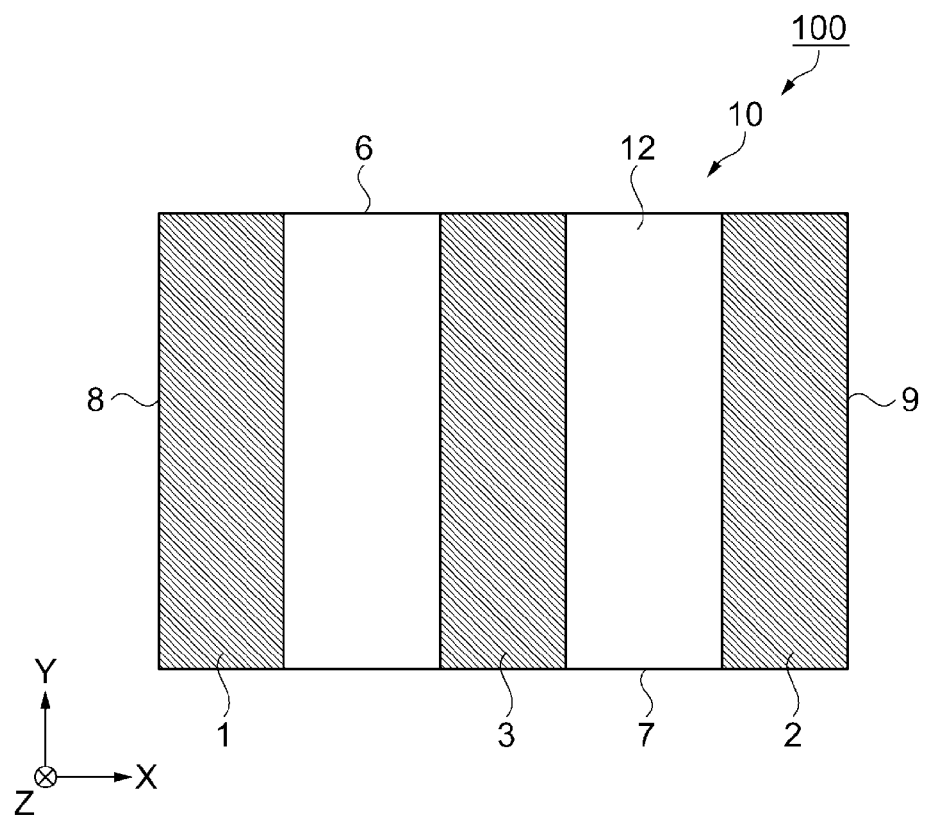
FIG. 3 is a schematic plan view showing external connection terminals of the oscillator.

FIG. 1 is a schematic plan view showing the schematic configuration of an oscillator 100 according to a first embodiment. FIG. 2 is a sectional view of the oscillator 100 taken along line A-A in FIG. 1. FIG. 3 is a schematic plan view showing external connection terminals of the oscillator 100.

First, the schematic configuration of the oscillator 100 according to the first embodiment is explained with reference to FIGS. 1 to 3.

As shown in FIGS. 1 and 2, the oscillator 100 includes an oscillation circuit 80, a vibration piece 11, and a container 10. The container 10 includes a package main body 17 formed in a rectangular box shape in order to include an oscillation circuit 80 and a vibration piece 11 and a lid body 16. Note that, in FIG. 1, for convenience of explanation, the lid body 16 is shown to be seen through.

The package main body 17 is configured by a substrate 12 that forms the bottom (on the −Z-axis side) of the package main body 17, a first frame body 13 that forms a housing space of the oscillation circuit 80 and a supporting table of the vibration piece 11, a second frame body 14 that forms a housing space of the vibration piece 11, and a seam ring 15 functioning as a joining material to the lid body 16.

As the material of the substrate 12, the first frame body 13, and the second frame body 14, for example, ceramic can be used. As the material of the seam ring 15, for example, kovar (an alloy of iron, nickel, and cobalt) can be used. The package main body 17 is formed by stacking and sintering the substrate 12 obtained by forming a green sheet in a predetermined shape, the first frame body 13, and the second frame body 14 and brazing the seam ring 15 on the upper surface (the surface on the +Z-axis side) of the second frame body 14 with, for example, silver solder. Note that the green sheet is formed from a sheet-like kneaded object generated by, for example, dispersing powder of ceramic in a predetermined solution and adding a binder to the powder. For the package main body 17, besides ceramic, glass, resin, and the like can also be used.

As the material of the lid body 16, for example, kovar can be used.

The package main body 17 includes an opening on the +Z-axis side. The seam ring 15 and the lid body 16, which form the opening of the package main body 17, are sealed using a resistance welding method (seam welding) or the like. Note that a cavity 21 of the package main body 17, in which the vibration piece 11 and the oscillation circuit 80 are housed, is in an inert gas atmosphere of nitrogen or the like or a decompressed atmosphere having pressure lower than the atmospheric pressure.

In this embodiment, the container 10 is explained as being obtained by sealing the package main body 17, which includes the seam ring 15, and the lid body 16 using the seam welding. However, it is also possible to adopt, for example, a method of sealing the container 10 with direct seam welding using a package main body not including the seam ring 15 and a lid body including a brazing material or a method of putting the container 10 in a furnace, melting the brazing material, and sealing the container 10.

An internal electrode 24 is formed on the surface on the +Z-axis side of the substrate 12 of the package main body 17. A bump (not shown in the figure) formed of a conductive material such as gold (Au) or solder is formed on the surface on the −Z-axis side of the oscillation circuit 80.

The oscillation circuit 80 is joined to the internal electrode 24 via the bump and electrically connected to the internal electrode 24 simultaneously with the joining. Note that the oscillation circuit 80 may be jointed to the surface on the +Z-axis side of the substrate 12 via a connection member such as an adhesive and electrically connected to the internal electrode 24 via a bonding wire or the like.

The first frame body 13 has a function of a supporting table that fixes the vibration piece 11. The inner wall of the first frame body 13 on the cavity 21 side extends further into the cavity 21 than the inner wall of the second frame body 14. An internal electrode 18 is provided on the surface on the +Z-axis side of an extending section extending from the +X-axis direction.

The vibration piece 11 is joined to and supported by the internal electrode 18 via a connection member 20 having electric conductivity and electrically connected to the internal electrode 18. Note that the vibration piece 11 may be joined to the surface on the +Z-axis side of the first frame body 13 via a connection member not having electric conductivity and electrically connected to the internal electrode 18 via a bonding wire or the like.

The internal electrode 18 is electrically connected to the internal electrode 24 via a via hole 26 disposed to pierce through the first frame body 13 from the surface on the +Z-axis side to the surface on the −Z-axis side. Consequently, the oscillation circuit 80 and the vibration piece 11 are electrically connected.

As shown in FIGS. 2 and 3, the container 10 includes a first terminal 1, a second terminal 2, and a third terminal 3 on the surface on the −Z-axis side of the substrate 12 of the package main body 17. Specifically, the container 10 includes, in plan view from the −Z-axis direction, a first side 6 and a second side 7 opposed to each other and a third side 8 and a fourth side 9 crossing the first side 6 and the second side 7 and opposed to each other.

The first terminal 1 is in contact with at least one side among the first side 6, the second side 7, and the third side 8 and is disposed in a direction along the third side 8. In this embodiment, the first terminal 1 is in contact with the first side 6, the second side 7, and the third side 8.

The second terminal 2 is in contact with at least one side among the first side 6, the second side 7, and the fourth side 9 and is disposed in a direction along the fourth side 9. In this embodiment, the second terminal 2 is in contact with the first side 6, the second side 7, and the fourth side 9.

The third terminal 3 is provided between the first terminal 1 and the second terminal 2.

The first terminal 1 is electrically connected to the oscillation circuit 80 by a not-shown internal wire. An input voltage based on a direct-current voltage, a voltage value of which can be changed, is applied to the first terminal 1.

The second terminal 2 is electrically connected to the oscillation circuit 80, the lid body 16 of the container 10, and a not-shown shield electrode by a not-shown internal wire. A ground voltage is applied to the second terminal 2.

The third terminal 3 is electrically connected to the oscillation circuit 80 by a not-shown internal wire. A first oscillation signal output from the oscillation circuit 80 is output from the third terminal 3. The third terminal 3 is provided between the first terminal 1 to which the input voltage is applied and the second terminal 2 to which the ground voltage is applied. Therefore, even when a component that emits high-frequency noise is mounted near the oscillator 100, it is possible to reduce deterioration in frequency accuracy of the first output signal with a shield effect by these terminals (the first terminal 1 and the second terminal 2).

As the material of the internal electrodes 18 and 24, the first terminal 1, the second terminal 2, and the third terminal 3, for example, a silver (Ag)/palladium (Pd) alloy and tungsten (W) can be used. The internal electrodes 18 and 24, the first terminal 1, the second terminal 2, and the third terminal 3 can be formed on the surface of the ceramic, which is the material of the substrate 12 and the first frame body 13, by metalizing the Ag/Pd alloy, the tungsten, or the like and performing sintering. Thereafter, plating is applied to the surfaces thereof with metal such as nickel (Ni), gold (Au), or silver (Ag).

Figure 4:
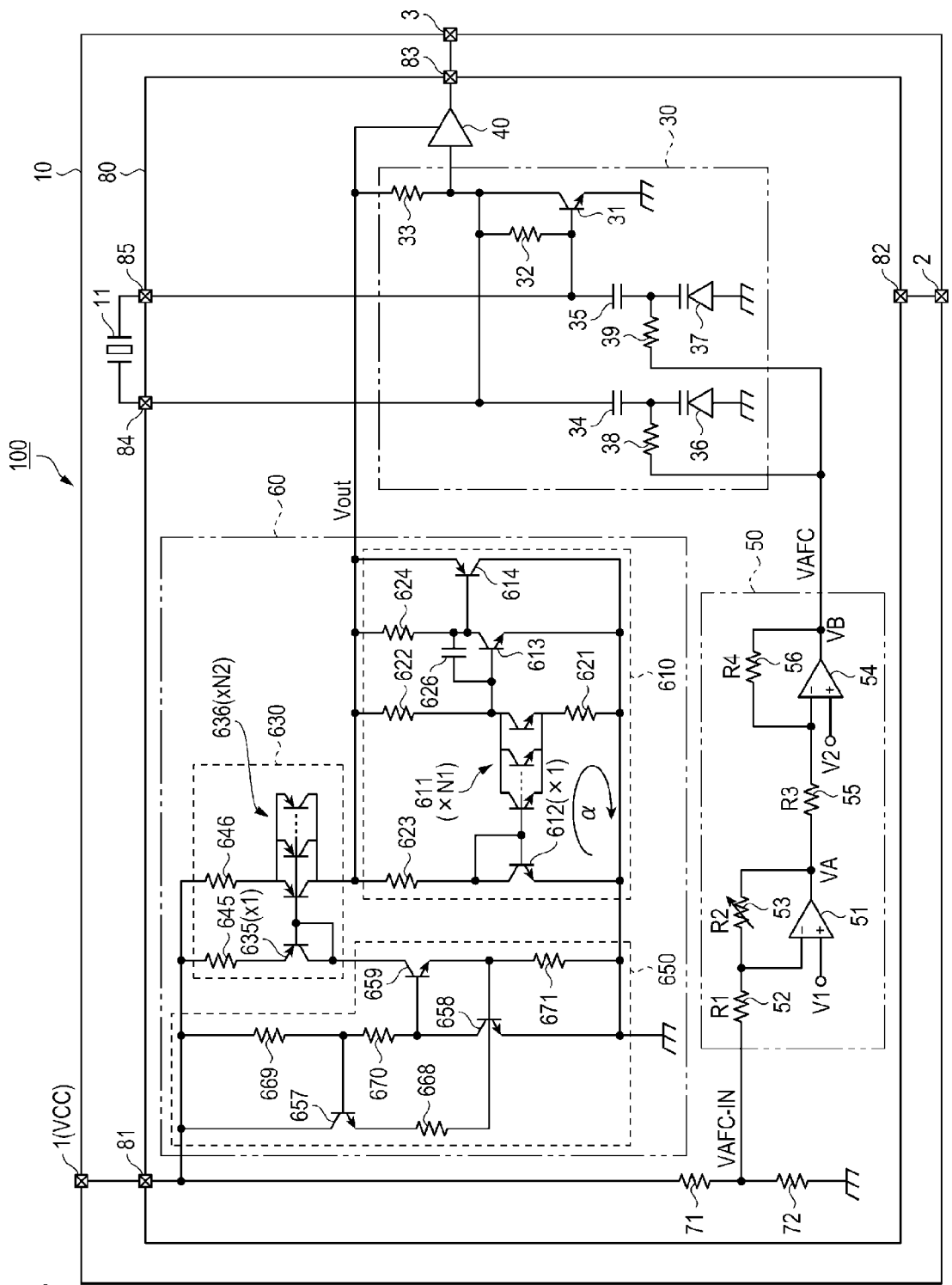
FIG. 4 is a functional block diagram of the oscillator.

FIG. 4 is a functional block diagram of the oscillator 100. The oscillator 100 in this embodiment is a voltage controlled xtal oscillator (VCXO). The oscillator 100 outputs an oscillation signal, the frequency of which is adjusted according to a control voltage from the outside (an input voltage based on a direct-current voltage, a voltage value of which can be changed).

The oscillator 100 includes the oscillation circuit 80, the vibration piece 11, and the container 10 including the oscillation circuit 80 and the vibration piece 11.

In the container 10, three external connection terminals, i.e., the first terminal 1, the second terminal 2, and the third terminal 3 for electric connection to the outside are provided.

The oscillation circuit 80 includes a circuit for oscillation 30, a signal adjustment circuit and a voltage adjustment circuit 60 connected to the circuit for oscillation 30, an output buffer 40, and resistors 71 and 72. The signal adjustment circuit includes an automatic frequency control (AFC) circuit 50. In this embodiment, the signal adjustment circuit is configured by the AFC circuit 50. A first oscillation signal is generated from the circuit for oscillation 30. The frequency of the first oscillation signal is adjusted according to a voltage value of an input voltage input to the AFC circuit (the signal adjustment circuit) 50. Note that the oscillation circuit 80 may have a configuration in which a part of these components are omitted or changed or other components are added.

The oscillation circuit 80 includes five terminals 81, 82, 83, 84, and 85.

The terminal 81 is connected to the first terminal of the container 10. An input voltage based on the direct-current voltage, the voltage value of which can be changed, applied to the first terminal is supplied to the circuit for oscillation 30 and the output buffer 40 via the voltage adjustment circuit 60 and supplied to the AFC circuit 50 via the resistor 71.

The terminal 82 is connected to the second terminal 2 of the container 10. The ground voltage applied to the second terminal 2 is supplied to the oscillation circuit 80.

The terminal 83 is connected to the third terminal 3 of the container 10. The first oscillation signal output from the circuit for oscillation 30 is output from the third terminal 3 via the output buffer 40.

The terminal 84 is connected to one end of the vibration piece 11. The terminal 85 is connected to the other end of the vibration piece 11. The vibration piece 11 is caused to oscillate by the circuit for oscillation 30.

Figure 13:
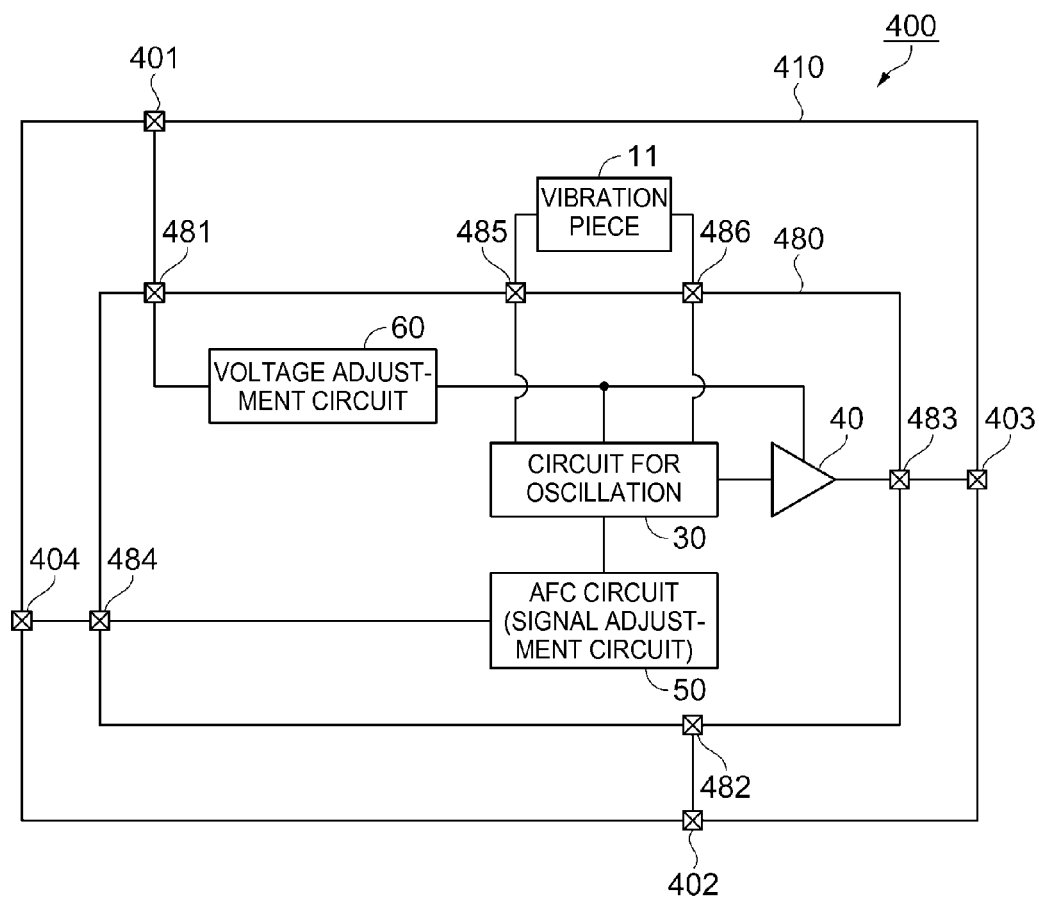
FIG. 13 is a functional block diagram of an oscillator according to the related art.

An oscillator 400 according to the related art is explained. FIG. 13 is a functional block diagram of the oscillator (VCXO) 400 according to the related art.

The oscillator 400 includes an oscillation circuit 480, the vibration piece 11, and a container 410 including the oscillation circuit 480 and the vibration piece 11.

In the container 410, four external connection terminals, i.e., a first terminal 401, a second terminal 402, a third terminal 403, and a fourth terminal 404 for electric connection to the outside are provided.

The oscillation circuit 480 includes the circuit for oscillation 30, the AFC circuit 50 and the voltage adjustment circuit 60 connected to the circuit for oscillation 30, and the output buffer 40.

In the oscillation circuit 480, six terminals 481, 482, 483, 484, 485, and 486 are provided.

The terminal 481 is connected to the first terminal 401 of the container 410. A direct-current voltage applied to the first terminal 401 is supplied to the circuit for oscillation 30 and the output buffer 40 via the voltage adjustment circuit 60.

The terminal 482 is connected to the second terminal 402 of the container 410. A ground voltage applied to the second terminal 402 is supplied to the oscillation circuit 480.

The terminal 483 is connected to the third terminal 403 of the container 410. A first oscillation signal output from the circuit for oscillation 30 is output from the third terminal 403 via the output buffer 40.

The terminal 484 is connected to the fourth terminal 404 of the container 410. A direct-current voltage, a voltage value of which can be changed, applied to the fourth terminal 404 is supplied to the AFC circuit 50.

The terminal 485 is connected to one end of the vibration piece 11. The terminal 486 is connected to the other end of the vibration piece 11. The vibration piece 11 is caused to oscillate by the circuit for oscillation 30.

The oscillator 400 needs, besides the third terminal 403 from which the first oscillation signal is output and the second terminal 402 to which the ground voltage is applied, external connection terminals for direct-current voltage application of two systems, i.e., the first terminal 401 for applying the direct-current voltage to the circuit for oscillation 30 and the fourth terminal 404 for applying the direct-current voltage, the voltage value of which can be changed, to the AFC circuit 50 for changing the frequency of the first oscillation signal.

Referring back to FIG. 4, the oscillator 100 is explained.

In the oscillator 100 in this embodiment, an input voltage is applied to the first terminal 1. The input voltage is a direct-current voltage, a voltage value of which can be changed, of one system and is a voltage obtained by superimposing a direct-current voltage necessary for driving the circuit for oscillation 30 and the output buffer 40 and a direct-current voltage having a variable width of a voltage value supplied to the AFC circuit 50 and necessary for changing the frequency of the first oscillation signal. Consequently, although the oscillator 400 in the related art needs the four external connection terminals (a first terminal 301, a second terminal 302, a third terminal 303, and a fourth terminal 304), the oscillator 100 in this embodiment can be configured by three external connection terminals (the first terminal 1, the second terminal 2, and the third terminal 3). With this configuration, the number of external connection terminals necessary for direct-current voltage application other than the terminal to which the ground voltage is applied can be reduced from two to one. Therefore, it is possible to reduce the size of the oscillator 100. The superimposed input voltage does not include a frequency signal. Therefore, a noise amount of the first oscillation signal decreases. It is possible to suppress deterioration in frequency accuracy caused by the reduction of the number of external connection terminals.

The configuration of the AFC circuit 50 is explained.

The AFC circuit 50 includes an operational amplifier 51, a resistor 52 having a resistance value R1, a variable resistor 53 having a resistance value R2, an operational amplifier 54, a resistor 55 having a resistance value R3, and a resistor 56 having a resistance value R4.

The first terminal 1 is connected to the resistor 71 via the terminal 81. The resistor 71 is connected to the resistor 72 in series. The resistor 52, which is an input end of the AFC circuit 50, is connected to the middle point of the resistor 71 and the resistor 72.

Therefore, the input voltage (VCC) based on the direct-current voltage, the voltage value of which can be changed, applied from the first terminal 1 is converted into a predetermined voltage value by a resistance voltage-dividing circuit configured by the resistor 71 and the resistor 72. A signal of the predetermined voltage value is applied to an input voltage (VAFC_IN) of the AFC circuit 50. For example, when the input voltage (VCC) that can be changed to 4±1 V is applied to the first terminal 1 and a resistor of 100Ω is connected to the resistor 71 and the resistor 72, a direct-current voltage of 2±0.5 V can be applied to the input voltage (VAFC_IN) of the AFC circuit 50.

The resistor 52 is connected between the middle point of the resistor 71 and the resistor 72 configuring the resistance voltage-dividing circuit and an inverted input terminal (a − terminal) of the operational amplifier 51. The variable resistor 53 is connected between the inverted input terminal (the − terminal) and an output terminal of the operational amplifier 51. A fixed voltage (V1) is input to a non-inverted input terminal (a + terminal) of the operational amplifier 51.

The resistor 55 is connected between the output terminal of the operational amplifier 51 and an inverted input terminal (a − terminal) of the operational amplifier 54. The resistor 56 is connected between the inverted input terminal (the − terminal) and an output terminal of the operational amplifier 54. A fixed voltage (V2) is applied to a non-inverted input terminal (a + terminal) of the operational amplifier 54. The output terminal of the operational amplifier 54 is connected to resistors 38 and 39 of the circuit for oscillation 30.

The resistance value R2 of the variable resistor 53 is a resistance value corresponding to a gain adjustment value stored in a not-shown memory.

In the AFC circuit 50 configured in this way, the input voltage (VAFC_IN) and an output voltage (VA) of the operational amplifier 51 are represented by the following Expression (1).

$$VA = V1 - \frac{R2 \cdot (VAFC\_IN - V1)}{R1} \qquad (1)$$

An output voltage (VB) of the operational amplifier 54 is represented by the following Expression (2).

$$VB = V2 - \frac{R4 \cdot (VA - V2)}{R3} \qquad (2)$$

The configuration of the circuit for oscillation 30 is explained.

The circuit for oscillation 30 is connected to the terminal 84 and the terminal 85 and causes the vibration piece 11 connected to the terminal 84 and the terminal 85 to oscillate. In an example shown in FIG. 4, the circuit for oscillation 30 includes an NPN-type bipolar transistor 31, resistors 32 and 33, capacitors 34 and 35, varactors (variable capacitance elements) 36 and 37, and the resistors 38 and 39.

A base terminal of the bipolar transistor 31 is connected to the terminal 85. A collector terminal of the bipolar transistor 31 is connected to the terminal 84. An emitter terminal of the bipolar transistor 31 is earthed.

The resistor 32 is connected between the base terminal and the collector terminal of the bipolar transistor 31. The resistor 33 is connected between an output terminal of the voltage adjustment circuit 60 and the collector terminal of the bipolar transistor 31.

The capacitor 34 is connected between the collector terminal of the bipolar transistor 31 and a cathode terminal of the varactor 36. The capacitor 35 is connected between the base terminal of the bipolar transistor 31 and a cathode terminal of the varactor 37.

An anode terminal of the varactor 36 and an anode terminal of the varactor 37 are earthed.

The resistor 38 is connected between an output terminal of the AFC circuit 50 and a cathode terminal of the varactor 36. The resistor 39 is connected between the output terminal of the AFC circuit 50 and the cathode terminal of the varactor 37.

The circuit for oscillation 30 configured as explained above includes the bipolar transistor 31 as an amplification element. The circuit for oscillation 30 amplifies an output signal of the vibration piece 11 input from the terminal 85 and supplies the amplified signal as an input signal to the vibration piece 11 via the terminal 84. Note that the circuit for oscillation 30 may be realized using, as the amplification element, a PNP type bipolar transistor, a field effect transistor (FET), a metal oxide semiconductor field effect transistor (MOSFET), a thyritor, or the like.

A first oscillation signal output from the collector terminal of the bipolar transistor 31, which is the first oscillation signal of the circuit for oscillation 30, is input to the output buffer 40. The first oscillation signal output from the output buffer 40 is output to the outside from the third terminal 3 of the container 10 via the terminal 83.

An output voltage (VAFC) of the AFC circuit 50 generated on the basis of a voltage value of the first terminal 1 is applied to the cathode terminals of the varactors 36 and 37. According to a voltage value of the output voltage (VAFC), capacitance values of the varactors 36 and 37 are set and the frequency of the first oscillation signal generated from the circuit for oscillation 30 is adjusted. For example, when V2=V1 and R3=R4 are set and Expression (1) is substituted in Expression (2) and arranged, the output voltage (VAFC) of the AFC circuit 50 is represented by the following Expression (3).

$$VAFC = VB = V1 + \frac{R2}{R1}(VAFC\_IN - V1) \quad (3)$$

As indicated by Expression (3), a gain of the AFC circuit 50 is R2/R1 and the output voltage (VAFC) is controlled by VAFC_IN, that is, a voltage value of an input voltage based on the direct-current voltage, the voltage value of which can be changed, input from the first terminal 1.

The configuration of the voltage adjustment circuit 60 is explained.

The voltage adjustment circuit 60 includes a reference voltage generation circuit 610, a current mirror circuit 630, and a reference current generation source 650.

First, the reference voltage generation circuit 610 is explained.

The reference voltage generation circuit 610 includes transistors 611, 612, 613, and 614, resistors 621, 622, 623, and 624, and a capacitor 626.

The transistors 611 and 612 have an emitter area ratio of N1:1 (in the figure, shown as ×N1 and ×1). Base terminals of the transistors 611 and 612 are connected to each other. An emitter terminal of the transistor 611 is earthed via the resistor 621. An emitter terminal of the transistor 612 is earthed. A base terminal and a collector terminal of the transistor 612 are connected. Collector terminals of the transistors 611 and 612 and an output terminal Vout are connected via the resistors 622 and 623. The collector terminal of the transistor 611 and a base terminal of the transistor 613 are connected. An emitter terminal of the transistor 613 is earthed. A collector terminal and the base terminal of the transistor 613 are connected via the capacitor 626. The collector terminal of the transistor 613 and the output terminal Vout are connected via the resistor 624. The collector terminal of the transistor 613 and a base terminal of the transistor 614 are connected. A collector terminal of the transistor 614 is earthed. An emitter terminal of the transistor 614 is connected to the output terminal Vout. A band gap loop α is configured by the transistors 611 and 612 and the resistor 621.

The current mirror circuit 630 and the reference current generation source 650 are explained.

The reference voltage generation circuit 610 includes, as a current supply circuit, the current mirror circuit 630 including transistors 635 and 636 and resistors 645 and 646 and the reference current generation source 650 including transistors 657, 658, and 659 and resistors 668, 669, 670, and 671.

The transistors 635 and 636 have an emitter area ratio of 1:N2 (in the figure, shown as ×1 and ×N2). Base terminals of the transistors 635 and 636 are connected. A base terminal and a collector terminal of the transistor 635 are connected. Emitter terminals of the transistors 635 and 636 are connected to the terminal 81 respectively via the resistors 645 and 646 and connected to the first terminal (VCC) of the container 10. A collector terminal of the transistor 636 is connected to the output terminal Vout. A collector terminal of the transistor 657 is connected to the first terminal 1 (VCC) of the container 10. An emitter terminal of the transistor 657 and a base terminal of the transistor 658 are connected via the resistor 668. A base terminal of the transistor 657 and the first terminal (VCC) of the container 10 are connected via the resistor 669. The base terminal of the transistor 657 and a collector terminal of the transistor 658 are connected via the resistor 670. The collector terminal of the transistor 658 and a base terminal of the transistor 659 are connected. An emitter terminal of the transistor 658 is earthed. Collector terminals of the transistor 659 and the transistor 635 are connected. An emitter terminal of the transistor 659 and the base terminal of the transistor 658 are connected. A connection point of the emitter terminal of the transistor 659 and the base terminal of the transistor 658 is earthed via the resistor 671.

By using the voltage adjustment circuit 60, the input voltage based on the direct-current voltage, the voltage value of which can be changed, applied to the first terminal 1 can be converted into a predetermined voltage value (a constant voltage value) and input to the circuit for oscillation 30 and the output buffer 40. For example, when an input voltage based on a direct-current voltage, a voltage value of which can be changed to 4±1 V, is applied to the voltage adjustment circuit 60 from the first terminal 1 via the terminal 81 of the oscillation circuit 80, a direct-current voltage of 3 V can be output from the output terminal Vout of the voltage adjustment circuit 60. Note that the voltage adjustment circuit 60 explained in this embodiment is an example. Voltage adjustment circuits having other configurations may be used.

Note that, in this embodiment, the oscillator 100 is explained as the VCXO. However, the invention can be applied to an oscillator that controls the frequency of an oscillation signal according to a voltage.

As explained above, with the oscillator 100 according to this embodiment, effects explained bellow can be obtained.

The oscillator 100 includes the oscillation circuit 80, the vibration piece 11, and the container 10. The oscillation circuit 80 includes the circuit for oscillation 30, the AFC circuit 50, and the voltage adjustment circuit 60. The container 10 includes the first terminal 1, the second terminal 2, and the third terminal 3.

The input voltage based on the direct-current voltage, the voltage value of which can be changed, is converted into the predetermined voltage value (the constant voltage value) by the voltage adjustment circuit 60 and applied to the circuit for oscillation 30 via the first terminal 1. The input voltage based on the direct-current voltage, the voltage value of which can be changed, is applied to the AFC circuit 50 via the first terminal 1 with the voltage value converted at a predetermined ratio by the resistance voltage-dividing circuit configured by the resistor 71 and the resistor 72. In the related art, it is necessary to supply electric power in the two systems of the direct-current voltage having the predetermined voltage value applied to the circuit for oscillation 30 and the direct-current voltage, the voltage value of which can be changed, applied to the AFC circuit 50 in order to adjust the frequency of the first oscillation signal. However, in the oscillator 100 (the oscillation circuit 80) in this embodiment, the electric power can be supplied by the input voltage based on the direct-current voltage, the voltage value of which can be changed, of the one system from the first terminal 1.

Consequently, the oscillator (VCXO) 100 capable of adjusting the frequency of the first oscillation signal can be configured by the small container 10 including the three external connection terminals, i.e., the first terminal 1 to which the input voltage is applied, the second terminal 2 to which the ground voltage is applied, and the third terminal 3 from which the first oscillation signal is output. The superimposed input voltage does not include a frequency signal. Therefore, since the input voltage is less likely to be noise for the first oscillation signal, it is possible to suppress deterioration in frequency accuracy of the first oscillation signal.

Therefore, it is possible to provide the oscillation circuit 80 capable of suppressing deterioration in frequency accuracy caused by a reduction in the number of external connection terminals and reducing the size of the oscillator and the oscillator 100 reduced in size.

Second Embodiment

An oscillator 200 according to a second embodiment is different from the first embodiment in that the oscillator 200 includes a fourth terminal, which outputs a second oscillation signal, and is adapted to a differential output.

Figure 5:
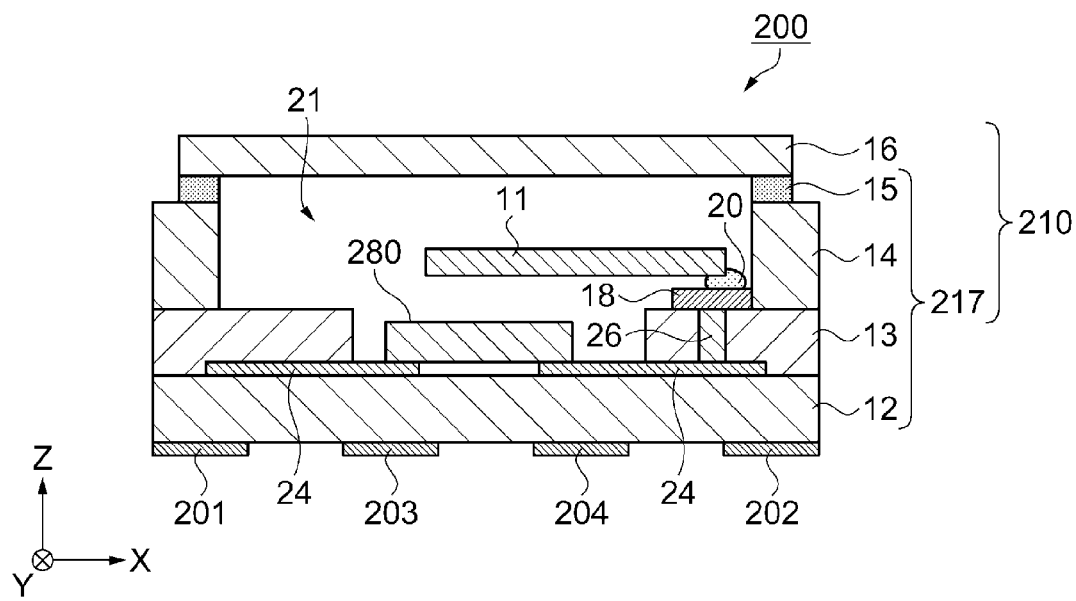
FIG. 5 is a sectional view of an oscillator according to a second embodiment taken along line A-A in FIG. 1.
Figure 6:
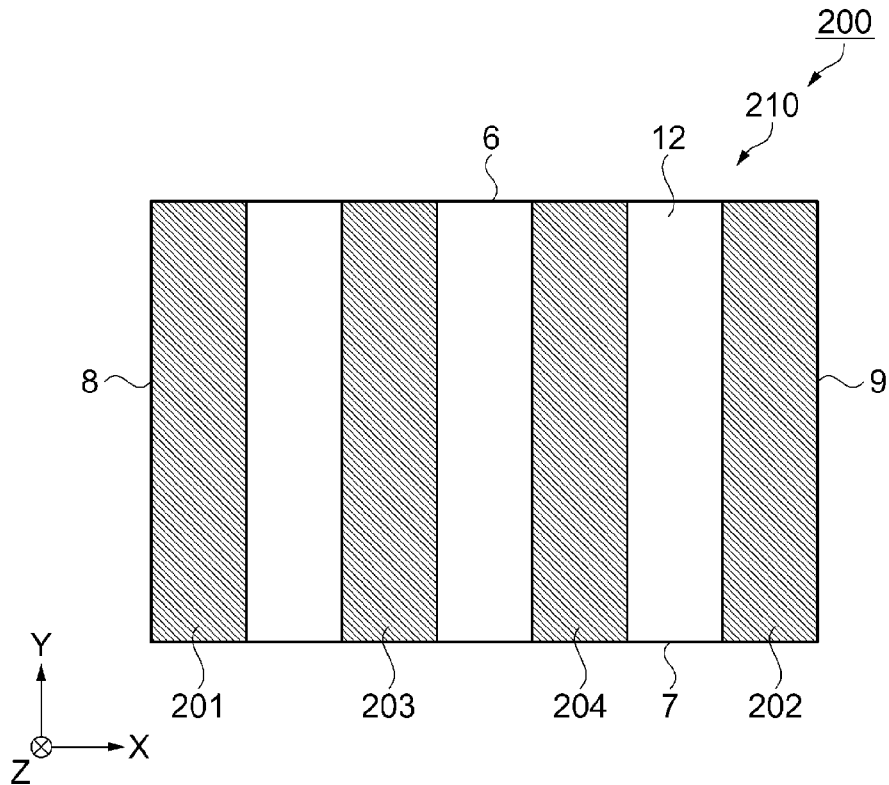
FIG. 6 is a schematic plan view showing external connection terminals of the oscillator.
Figure 7:
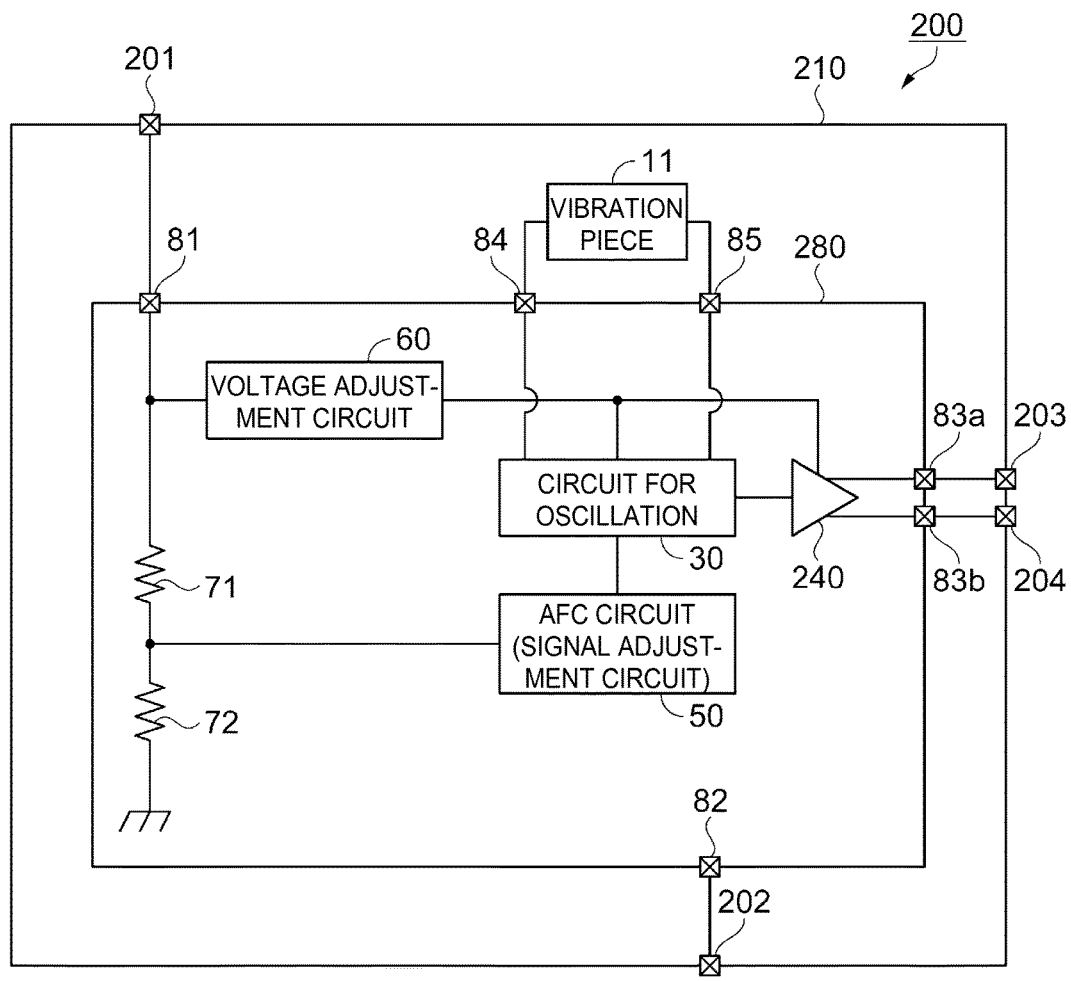
FIG. 7 is a functional block diagram of the oscillator.

FIG. 5 is a sectional view of the oscillator 200 according to the second embodiment taken along line A-A in FIG. 1. FIG. 6 is a schematic plan view showing external connection terminals of the oscillator 200. FIG. 7 is a functional block diagram of the oscillator 200. Note that, in FIG. 7, the internal structures of the circuit for oscillation 30, the AFC circuit 50, and the voltage adjustment circuit 60 same as the internal structures shown in FIG. 4 are not shown.

First, the schematic configuration of the oscillator 200 according to the second embodiment is explained with reference to FIGS. 5 to 7. Note that components same as the components of the oscillator 100 in the first embodiment are denoted by the same reference numerals and signs and redundant explanation of the components is omitted.

As shown in FIG. 5, the oscillator 200 includes an oscillation circuit 280, the vibration piece 11, and a container 210. The container 210 includes a package main body 217 formed in a rectangular box shape in order to include the oscillation circuit 280 and the vibration piece 11 and the lid body 16. On the surface on the −Z-axis side of the container 200, four external connection terminals, i.e., a first terminal 201, a second terminal 202, a third terminal 203, and a fourth terminal 204 for electric connection to the outside are provided.

As shown in FIGS. 5 and 6, on the surface on the −Z-axis side of the substrate 12 of the package main body 217, the first terminal 201, the second terminal 202, the third terminal 203, and the fourth terminal 204 are provided. Specifically, the container 210 includes, in plan view from the −Z-axis direction, the first side 6 and the second side 7 opposed to each other and the third side 8 and the fourth side 9 crossing the first side 6 and the second side 7 and opposed to each other.

The first terminal 201 is in contact with at least one of the first side 6, the second side 7, and the third side 8 and disposed in a direction along the third side 8. In this embodiment, the first terminal 201 is in contact with the first side 6, the second side 7, and the third side 8.

The second terminal 202 is in contact with at least one of the first side 6, the second side 7, and the fourth side 9 and disposed in a direction along the fourth side 9. In this embodiment, the second terminal 202 is in contact with the first side 6, the second side 7, and the fourth side 9.

The third terminal 203 is provided between the first terminal 201 and the second terminal 202.

The fourth terminal 204 is provided between any one of the first terminal 201 and the second terminal 202 and the third terminal 203. In this embodiment, the fourth terminal 204 is provided between the second terminal 202 and the third terminal 203.

The first terminal 201 is electrically connected to the oscillation circuit 280 by a not-shown internal wire. An input voltage based on a direct-current voltage, a voltage value of which can be changed, is applied to the first terminal 201.

The second terminal 202 is electrically connected to the oscillation circuit 280, the lid body 16 of the container 210, and a not-shown shield electrode by a not-shown internal wire. A ground voltage is applied to the second terminal 202.

The third terminal 203 and the fourth terminal 204 are electrically connected to the oscillation circuit 280 by a not-shown internal wire. A first oscillation signal output from the oscillation circuit 280 is output from the third terminal 203. A second oscillation signal having a phase 180 degrees different from the phase of the first oscillation signal is output from the fourth terminal 204. The third terminal 203 and the fourth terminal 204 are provided between the first terminal 201 to which the input voltage is applied and the second terminal 202 to which the ground voltage is applied. Therefore, even when a component that emits high-frequency noise is mounted near the oscillator 200, it is possible to reduce deterioration in frequency accuracy of the first output signal and the second oscillation signal with a shield effect by these terminals (the first terminal 201 and the second terminal 202).

As shown in FIG. 7, the oscillation circuit 280 includes six terminals 81, 82, 83*a*, 83*b*, 84, and 85.

The terminal 81 is connected to the first terminal 201 of the container 210. The input voltage based on the direct-current voltage, the voltage value of which can be changed, supplied to the first terminal 201 is supplied to the circuit for oscillation 30 and an output buffer 240 via the voltage adjustment circuit 60 and supplied to the AFC circuit 50 via the resistor 71.

The terminal 82 is connected to the second terminal 202 of the container 210. The ground voltage applied to the second terminal 202 is supplied to the oscillation circuit 280.

The terminal 83a is connected to the third terminal 203 of the container 210. The first oscillation signal output from the circuit for oscillation 30 is output from the third terminal 203 via the output buffer 240.

The terminal 83b is connected to the fourth terminal 204 of the container 210. The first oscillation signal output from the circuit for oscillation 30 is output from the fourth terminal 204 via the output buffer 240.

An oscillation signal of a single-end output of the circuit for oscillation 30 is input to the output buffer 240 having a differential signal processing function. The oscillation signal of the single-end output is converted into a differential output between the first oscillation signal and the second oscillation signal having a phase difference of 180 degrees by the output buffer 240. The first oscillation signal is output to the outside from the third terminal 203 of the container 210 via the terminal 83a. The second oscillation signal is output to the outside of the fourth terminal 204 of the container 210 via the terminal 83b.

As explained above, with the oscillator 200 according to this embodiment, effects explained below can be obtained.

The oscillator 200 includes the oscillation circuit 280, the vibration piece 11, and the container 210. The oscillation circuit 280 includes the circuit for oscillation 30, the AFC circuit 50, the voltage adjustment circuit 60, and the output buffer 240. The container 210 includes the first terminal 201, the second terminal 202, the third terminal 203, and the fourth terminal 204.

The input voltage based on the direct-current voltage, the voltage value of which can be changed, is applied from the first terminal 201 to the oscillation circuit 280 via the voltage adjustment circuit 60 and to the AFC circuit 50 via a resistance voltage-dividing circuit. Consequently, direct-current voltages other than the ground voltage necessary for the oscillator 200 are reduced from two systems to one system. Therefore, the number of external connection terminals necessary for inputting direct-current voltages other than a terminal to which the ground voltage is applied of the container 210 can be reduced from two to one.

The oscillation circuit 280 includes the output buffer 240 having the differential signal processing function. Therefore, the first oscillation signal and the second oscillation signal having a phase difference of 180 degrees each other can be output to the outside from the third terminal 203 and the fourth terminal 204 of the container 210.

Therefore, it is possible to provide the oscillator (VCXO) 200 having the differential output function configured by the small container 210 including the four terminals.

Note that the invention is not limited to the embodiments explained above. Various changes, improvements, and the like can be added to the embodiments. A modification is explained below.

Modification

An oscillator 300 according to a modification is different from the second embodiment in that a first oscillation signal and a second oscillation signal having different frequencies are output.

Figure 8:
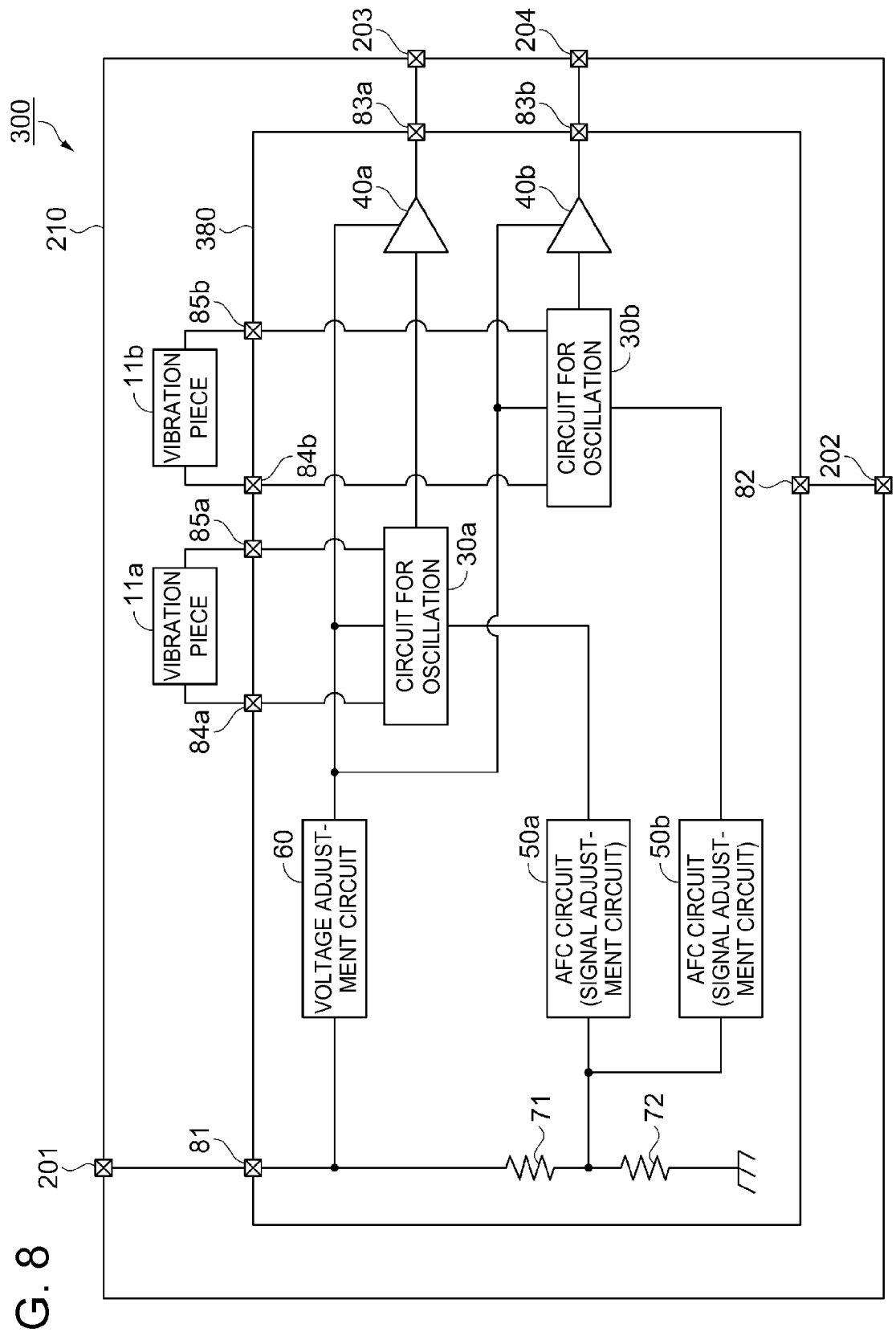
FIG. 8 is a functional block diagram of an oscillator according to a modification.

FIG. 8 is a functional block diagram of the oscillator 300 according to the modification. The schematic configuration of the oscillator 300 according to the modification is explained with reference to FIG. 8. Note that components same as the components of the oscillator 200 in the second embodiment are denoted by the same reference numerals and signs and redundant explanation of the components is omitted.

As shown in FIG. 8, the oscillator 300 includes an oscillation circuit 380, vibration pieces 11a and 11b, and the container 210.

The oscillation circuit 380 includes eight terminals 81, 82, 83a, 83b, 84a, 84b, 85a, and 85b.

The oscillation circuit 380 includes a circuit for oscillation 30a that generates a first oscillation signal, an output buffer 40a, an AFC circuit 50a, a circuit for oscillation 30b that generates a second oscillation signal, an output buffer 40b, an AFC circuit 50b, the voltage adjustment circuit 60, and the resistors 71 and 72 configuring a resistance voltage-dividing circuit.

The terminal 81 is connected to the first terminal 201 of the container 210. The input voltage based on the direct-current voltage, the voltage value of which can be changed, supplied to the first terminal 201 is supplied to the circuit for oscillations 30a and 30b and the output buffers 40a and 40b via the voltage adjustment circuit 60 and to the AFC circuits 50a and 50b via the resistor 71 configuring the resistance voltage-dividing circuit.

The terminal 82 is connected to the second terminal 202 of the container 210. The ground voltage applied to the second terminal 202 is supplied to the oscillation circuit 380.

The terminal 83a is connected to the third terminal 203 of the container 210. The first oscillation signal output from the circuit for oscillation 30a is output from the third terminal 203 via the output buffer 40a.

The terminal 83b is connected to the fourth terminal 204 of the container 210. The second oscillation signal output from the circuit for oscillation 30b is output from the fourth terminal 204 via the output buffer 40b.

The terminal 84a is connected to one end of the vibration piece 11a. The terminal 85a is connected to the other end of the vibration piece 11a. The vibration piece 11a is caused to oscillate by the circuit for oscillation 30a.

The terminal 84b is connected to one end of the vibration piece 11b. The terminal 85b is connected to the other end of the vibration piece 11b. The vibration piece 11b is caused to oscillate by the circuit for oscillation 30.

The internal structure of the circuits for oscillation 30a and 30b is the same as the internal structure of the circuit for oscillation 30 of the oscillator 200 (the oscillator 100). The internal structure of the AFC circuits 50a and 50b is the same as the internal structure of the AFC circuit 50 of the oscillator 200 (the oscillator 100). Therefore, explanation of the internal structures is omitted.

As explained above, with the oscillator 300 according to this modification, in addition to the effects in the second embodiment, effects explained below can be obtained.

The oscillator 300 includes the vibration piece 11a that outputs the first oscillation signal, the circuit for oscillation 30a, the AFC circuit 50a, the output buffer 40a, the vibration piece 11b that outputs the second oscillation signal, the circuit for oscillation 30b, the AFC circuit 50b, and the output buffer 40b. Therefore, it is possible to output the first oscillation signal and the second oscillation signal having different frequencies.

The input voltage based on the direct-current voltage, the voltage value of which can be changed, is applied from the first terminal 1 to the circuits for oscillation 30a and 30b via the voltage adjustment circuit 60 and to the AFC circuits 50a and 50b via the resistance voltage-dividing circuit. Consequently, direct-current voltages other than the ground voltage necessary for the oscillator 300 are reduced from two systems to one system. Therefore, the number of external connection terminals of the container 210 necessary for inputting direct-current voltages other than a terminal to which the ground voltage is applied can be reduced from two to one.

Therefore, it is possible to provide the oscillator (VCXO) 300 having a function of outputting oscillation signals having different frequencies configured by the small container 210 including the four terminals. Note that, in this modification, the first oscillation signal and the second oscillation signal are explained as having the different frequencies. However, the first oscillation signal and the second oscillation signal may have the same frequency.

Electronic Apparatus

An electronic apparatus including an oscillation circuit (an oscillator) according to an embodiment of the invention is explained with reference to FIGS. 9 to 11. Note that, in the following explanation, an example of an electronic apparatus including the oscillator 100 (the oscillation circuit 80) is explained.

Figure 9:
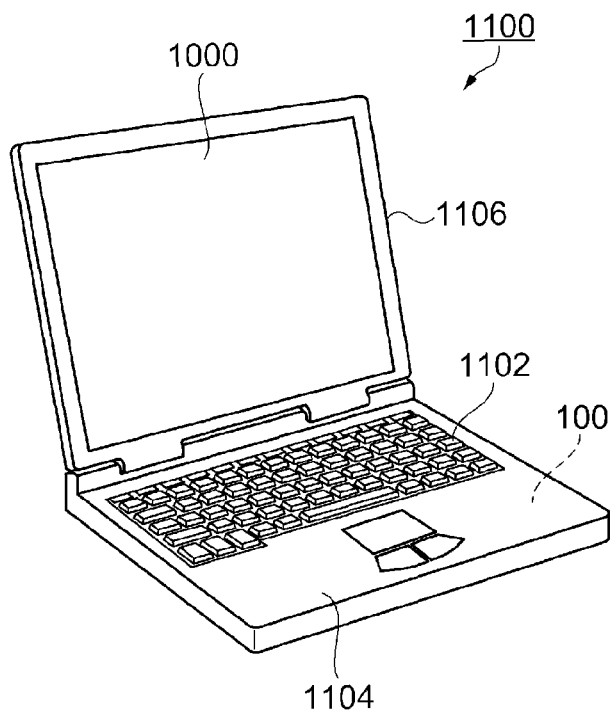
FIG. 9 is a perspective view showing the configuration of a mobile (or notebook) personal computer functioning as an electronic apparatus including an oscillator (an oscillation circuit).

FIG. 9 is a perspective view showing the schematic configuration of a mobile (notebook) personal computer 1100, which is an example of the electronic apparatus including the oscillator 100 (the oscillation circuit 80) according to the embodiment. As shown in FIG. 9, the personal computer 1100 is configured by a main body section 1104 including a keyboard 1102 and a display unit 1106 including a display section 1000. The display unit 1106 is turnably supported via a hinge structure section with respect to the main body section 1104. The personal computer 1100 incorporates the oscillator 100 (the oscillation circuit 80).

As explained above, in the mobile (notebook) personal computer 1100, which is an example of the electronic apparatus, the oscillator 100 (the oscillation circuit 80) according to the embodiment is provided as, for example, a clock source. Consequently, the mobile personal computer 1100 can be reduced in size. In the oscillator 100 (the oscillation circuit 80) according to the embodiment, for example, an output terminal of a signal output as a clock source supplied to the mobile personal computer 1100 is shielded by being disposed between a terminal to which an input voltage is applied and a terminal to which a ground voltage is applied. Therefore, it is possible to reduce deterioration in frequency accuracy of the signal output as the clock source and improve reliability of the operation of the mobile personal computer 1100.

Figure 10:
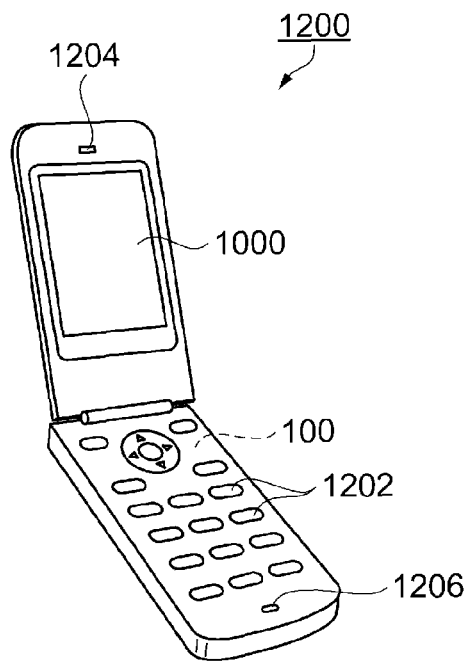
FIG. 10 is a perspective view showing a cellular phone functioning as the electronic apparatus including the oscillator (the oscillation circuit).

FIG. 10 is a perspective view showing the schematic configuration of a cellular phone 1200 (including a PHS), which is an example of the electronic apparatus including the oscillator 100 (the oscillation circuit 80) according to the embodiment. As shown in FIG. 10, the cellular phone 1200 includes a plurality of operation buttons 1202, an earpiece 1204, and a mouthpiece 1206. The display section 1000 is disposed between the operation buttons 1202 and the earpiece 1204. The cellular phone 1200 incorporates the oscillator 100 (the oscillation circuit 80).

As explained above, in the cellular phone (including the PHS) 1200, which is an example of the electronic apparatus, the oscillator 100 (the oscillation circuit 80) according to the embodiment is provided as, for example, a clock source. Consequently, the cellular phone 1200 can be reduced in size. In the oscillator 100 (the oscillation circuit 80) according to the embodiment, for example, an output terminal of a signal output as a clock source supplied to the cellular phone 1200 is shielded by being disposed between a terminal to which an input voltage is applied and a terminal to which a ground voltage is applied. Therefore, it is possible to reduce deterioration in frequency accuracy of the signal output as the clock source and improve reliability of the operation of the cellular phone 1200.

Figure 11:
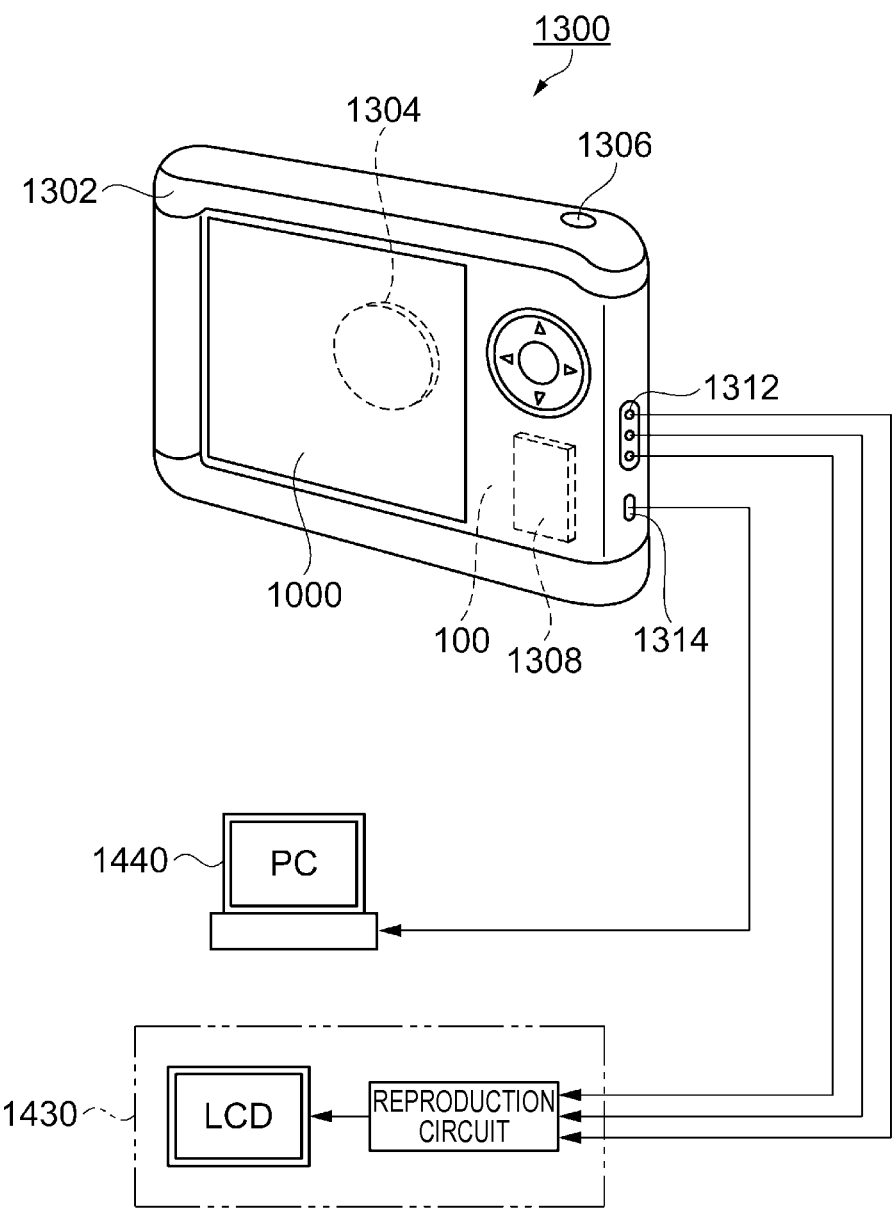
FIG. 11 is a perspective view showing a digital camera functioning as the electronic apparatus including the oscillator (the oscillation circuit).

FIG. 11 is a perspective view showing the schematic configuration of a digital camera 1300, which is an example of the electronic apparatus including the oscillator 100 (the oscillation circuit 80) according to the embodiment. Note that, in FIG. 11, connection to external apparatuses is also simply shown. A film camera in the past exposes a silver salt photographic film with an optical image of an object. On the other hand, the digital camera 1300 photoelectrically converts an optical image of an object with an image pickup device such as a CCD (Charge Coupled Device) and generates a picked-up image (an image signal).

The display section 1000 is provided on the back of a case (a body) 1302 in the digital camera 1300. The display section 1000 performs display on the basis of an image pickup signal by the CCD. The display section 1000 functions as a finder that displays the object as an electronic image. A light receiving unit 1304 including an optical lens (an image pickup optical system) and a CCD is provided on the front side (the rear side in the figure) of the case 1302.

When a photographer checks an object image displayed on the display section 1000 and depresses a shutter button 1306, an image pickup signal of the CCD at that point is transferred to and stored in a memory 1308. In the digital camera 1300, an output terminal 1312 for a video signal and an input/output terminal 1314 for data communication are provided on a side of the case 1302. As shown in the figure, according to necessity, a television monitor 1430 is connected to the output terminal 1312 for a video signal and a personal computer 1440 is connected to the input/output terminal 1314 for data communication. Further, according to predetermined operation, the image pickup signal stored in the memory 1308 is output to the television monitor 1430 and the personal computer 1440. The digital camera 1300 incorporates the oscillator 100 (the oscillation circuit 80).

As explained above, in the digital camera 1300, which is an example of the electronic apparatus, the oscillator 100 (the oscillation circuit 80) according to the embodiment is provided as, for example, a clock source. Consequently, the digital camera 1300 can be reduced in size. In the oscillator 100 (the oscillation circuit 80) according to the embodiment, for example, an output terminal of a signal output as a clock source supplied to the digital camera 1300 is shielded by being disposed between a terminal to which an input voltage is applied and a terminal to which a ground voltage is applied. Therefore, it is possible to reduce deterioration in frequency accuracy of the signal output as the clock source and improve reliability of the operation of the digital camera 1300.

Note that the oscillator 100 (the oscillation circuit 80) according to the embodiment can be applied to, besides the personal computer 1100 (the mobile personal computer) shown in FIG. 9, the cellular phone 1200 shown in FIG. 10, and the digital camera 1300 shown in FIG. 11, electronic apparatuses such as an inkjet-type discharge apparatus (e.g., an inkjet printer), a laptop personal computer, a tablet personal computer, storage area network apparatuses such as a router and a switch, a local area network apparatus, apparatuses for a mobile terminal base station, a television, a video camera, a video recorder, a car navigation apparatus, a pager, an electronic organizer (including an electronic organizer attached with a communication function), an electronic dictionary, an electric calculator, an electronic game machine, a word processor, a work station, a video telephone, a television monitor for crime prevention, an electronic binocular, a POS terminal, medical apparatuses (e.g., an electronic thermometer, a sphygmomanometer, a blood sugar level meter, an electrocardiographic apparatus, an ultrasonic diagnostic apparatus, and an electronic endoscope), a fish finder, various measurement apparatuses, meters (e.g., meters of a vehicle, an airplane, and a ship), a flight simulator, a head mounted display, a motion tracer, a motion tracker, a motion controller, and a PDR (pedestrian dead reckoning) device.

Moving Object

A moving object including the oscillation circuit (the oscillator) according to the embodiment is explained with reference to FIG. 12. Note that, in the following explanation, an example of a moving object including the oscillator 100 (the oscillation circuit 80) is explained.

Figure 12:
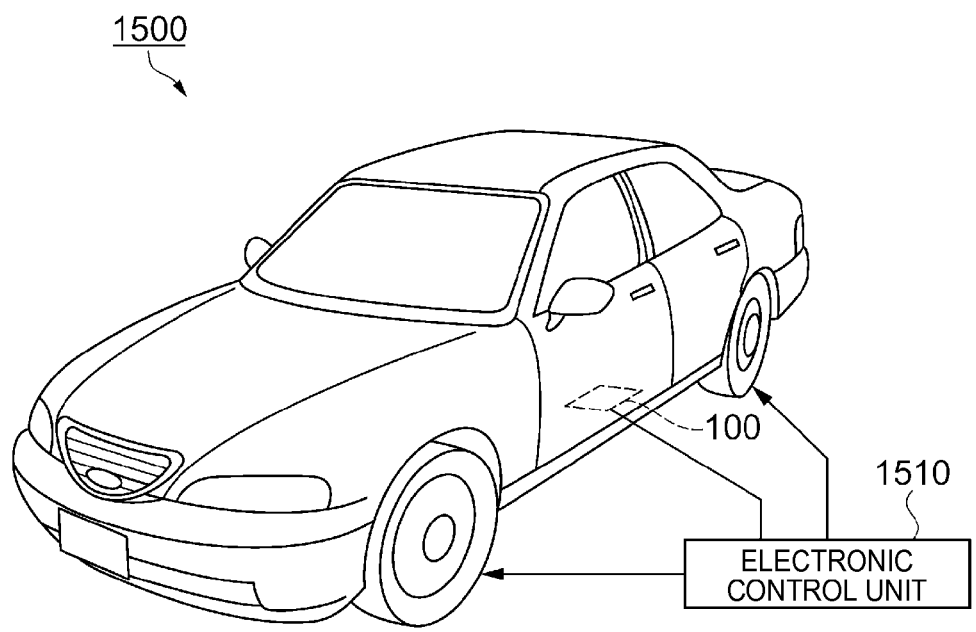
FIG. 12 is a perspective view showing an automobile functioning as a moving object including the oscillator (the oscillation circuit).

FIG. 12 is a perspective view schematically showing an automobile 1500, which is an example of the moving object including the oscillator 100 (the oscillation circuit 80) according to the embodiment.

The oscillator 100 (the oscillation circuit 80) according to the embodiment is mounted on the automobile 1500. As shown in FIG. 12, in the automobile 1500 functioning as the moving object, an electronic control unit 1510 that incorporates the oscillator 100 (the oscillation circuit 80) and controls tires and the like is mounted on a vehicle body. Besides, the oscillator 100 (the oscillation circuit 80) can also be widely applied to electronic control units (ECUs) such as a keyless entry unit, an immobilizer, a car navigation system, a car air conditioner, an antilock brake system (ABS), an airbag, a tire pressure monitoring system (TPMS), an engine control unit, a brake system, battery monitors for a hybrid automobile and an electronic automobile, and a vehicle body posture control system.

As explained above, in the automobile 1500, which is an example of the moving object, the oscillator 100 (the oscillation circuit 80) according to the embodiment is provided as, for example, a clock source. Consequently, at least one of the automobile 1500 and the electronic control unit 1510 can be reduced in size. In the oscillator 100 (the oscillation circuit 80) according to the embodiment, for example, an output terminal of a signal output as a clock source supplied to at least one of the automobile 1500 and the electronic control unit 1510 is shielded by being disposed between a terminal to which an input voltage is applied and a terminal to which a ground voltage is applied. Therefore, it is possible to reduce deterioration in frequency accuracy of the signal output as the clock source and improve reliability of the operation of at least one of the automobile 1500 and the electronic control unit 1510.

The entire disclosure of Japanese Patent Application No. 2014-124061, filed Jun. 17, 2014 is expressly incorporated by reference herein.

What is claimed is:

1. An oscillation circuit comprising:
  a circuit for oscillation, wherein the circuit causes a vibration piece to oscillate and the circuit outputs a first oscillation signal;
  a voltage adjustment circuit connected to the circuit for oscillation;
  a signal adjustment circuit connected to the circuit for oscillation and that adjusts a frequency of the first oscillation signal; and
  a terminal that receives a direct-current voltage, wherein the voltage adjustment circuit and the signal adjustment circuit are coupled to the terminal and receive an input voltage based on the direct-current voltage, further wherein:
    the voltage adjustment circuit converts the direct-current voltage to a predetermined voltage value, and outputs the predetermined voltage value to the circuit for oscillation,
    the signal adjustment circuit determines an output voltage based on the direct-current voltage and provides the output voltage to the circuit for oscillation, wherein the output voltage controls the frequency of the first oscillation signal, and
    the direct-current voltage is a voltage that has been superimposed with variable voltage of variable width in order to adjust the power supply for driving the circuit for oscillation and to adjust the frequency of the first oscillation signal.

2. The oscillation circuit according to claim 1, wherein the circuit for oscillation includes a variable capacitance element, and
  a capacitance value of the variable capacitance element is set according to the output voltage from the signal adjustment circuit.

3. An oscillator comprising:
  the oscillation circuit according to claim 2;
  a vibration piece; and
  a container including the oscillation circuit and the vibration piece, wherein
  the container includes:
    a first side and a second side opposed to each other in plan view;
    a third side and a fourth side crossing the first side and the second side and opposed to each other in plan view;
    a first terminal in contact with at least one side among the first side, the second side, and the third side and disposed in a direction along the third side;
    a second terminal in contact with at least one side among the first side, the second side, and the fourth side and disposed in a direction along the fourth side; and
    a third terminal provided between the first terminal and the second terminal,
  the first terminal is the terminal to which an input voltage based on the direct-current voltage, a voltage value of which can be changed, is applied,
  the second terminal is a terminal to which a ground voltage is applied, and
  the third terminal is a terminal from which a first oscillation signal output from the oscillation circuit is output.

4. An electronic apparatus comprising the oscillation circuit according to claim 2.

5. A moving object comprising the oscillation circuit according to claim 2.

6. The oscillation circuit according to claim 1, wherein the signal adjustment circuit includes an automatic frequency control circuit.

7. An oscillator comprising:
  the oscillation circuit according to claim 1;
  a vibration piece; and
  a container including the oscillation circuit and the vibration piece, wherein
  the container includes:
    a first side and a second side opposed to each other in plan view;
    a third side and a fourth side crossing the first side and the second side and opposed to each other in plan view;

a first terminal in contact with at least one side among the first side, the second side, and the third side and disposed in a direction along the third side;

a second terminal in contact with at least one side among the first side, the second side, and the fourth side and disposed in a direction along the fourth side; and a third terminal provided between the first terminal and the second terminal, the first terminal is the terminal to which an input voltage based on the direct-current voltage, a voltage value of which can be changed, is applied, the second terminal is a terminal to which a ground voltage is applied, and the third terminal is a terminal from which a first oscillation signal output from the oscillation circuit is output.

8. The oscillator according to claim 7, wherein the container includes a fourth terminal provided between any one of the first terminal and the second terminal and the third terminal, and a second oscillation signal output from the oscillation circuit is output from the fourth terminal.

9. An electronic apparatus comprising the oscillation circuit according to claim 1.

10. A moving object comprising the oscillation circuit according to claim 1.

11. The oscillation circuit according to claim 1 wherein the voltage adjustment circuit includes a band gap loop.

12. The oscillation circuit according to claim 1 further comprises:

an output buffer that receives the predetermined voltage value from the voltage adjustment circuit.

13. The oscillation circuit according to claim 1 wherein the signal adjustment circuit includes an operational amplifier that outputs the output voltage based on the direct-current voltage, wherein the output voltage is linear function of an input voltage that is based on the direct-current voltage.

* * * * *